United States Patent [19]

Jean

[11] 4,188,714
[45] Feb. 19, 1980

[54] RIGID TERMINATION FOR FLEXIBLE PRINTED CIRCUITS

[75] Inventor: Larry Jean, Nashua, N.H.

[73] Assignee: Teledyne Electro-Mechanisms, Nashua, N.H.

[21] Appl. No.: 896,747

[22] Filed: Apr. 17, 1978

[51] Int. Cl.² ........................................... H01R 43/02
[52] U.S. Cl. ...................................... 29/628; 29/629; 339/17 F
[58] Field of Search ............... 29/629, 630 B, 630 C, 29/630 R, 630 A, 628; 339/17 R, 17 LC, 17 LM, 17 E, 17 F, 19, 17 L; 174/117 F, 117 PC

[56] References Cited

U.S. PATENT DOCUMENTS

| 3,004,237 | 10/1967 | Cole et al. ................ 339/17 F X |
| 3,221,286 | 11/1965 | Fedde . | |
| 3,258,831 | 7/1966 | Angele et al. ................ 29/629 X |
| 3,399,452 | 9/1968 | Reid ................ 339/17 L X |
| 3,744,128 | 7/1973 | Fisher et al. ................ 29/629 |
| 3,920,301 | 11/1975 | Roberts et al. ................ 339/17 F |
| 3,997,229 | 12/1976 | Narozny et al. ................ 339/17 F X |
| 4,064,622 | 12/1977 | Morris et al. ................ 29/629 X |
| 4,085,502 | 4/1978 | Ostman et al. ................ 29/629 |

Primary Examiner—Francis S. Husar
Assistant Examiner—C. J. Arbes
Attorney, Agent, or Firm—Brumbaugh, Graves, Donohue & Raymond

[57] ABSTRACT

A flexible jumper strip has rigid support members soldered to the pins formed by the ends of its leads in order to increase their mechanical strength. In making the jumper strip, conductor leads are formed on a conductor sheet laminated to a smaller insulator sheet so that the ends of the leads extend beyond the insulator to form termination pins. The rigid support members are registered over the pins by means of a lead frame and are then soldered to them.

5 Claims, 5 Drawing Figures

RIGID TERMINATION FOR FLEXIBLE PRINTED CIRCUITS

BACKGROUND OF THE INVENTION

This invention relates to printed circuit connectors and, more particularly, to flexible jumper strips.

In the construction of electrical assemblies, sub-systems made on hard or flexible printed circuits are often used. These sub-systems then have to be connected together with jumper cables or strips. Typically, the jumper strips are made in the form of a plurality of parallel conductors encased between insulating layers with terminating pins at the ends of each lead extending beyond the insulation. Such a jumper strip is shown in U.S. Pat. No. 3,221,286 issued to G. A. Fedde.

Most of the prior art jumper strips are either not flexible or they tend to flex or bend in the wrong areas. The weakest point is often where the pins enter the insulation. This results in a sharp crease or bend which can eventually lead to the breaking of the pin. Also, the flexing of such jumpers results in a separation of the insulating layers from the conductor. To overcome these problems, a flexible jumper made by encasing a conductor pattern between two insulating sheets and imparting a V-shape to the pins is disclosed in U.S. Pat. No. 4,064,622 filed Apr. 30, 1976 to Gilbert Morris, et al. and assigned to the assignee of the present invention. While the Morris et al. jumper strip does overcome many of the problems inherent in the prior art, nevertheless, it suffers from deficiencies of its own. In particular, a mechanical force is applied to the pins in order to impart the V-shape. This may eventually result in the breakdown of the pins themselves.

In the connector described in U.S. Pat. No. 3,997,229 to Narozny et al. the strength of a jumper strip at the transition from the insulation to the termination pins is increased by soldering individual stiffening rods to the pins. However, this is a costly and time consuming process.

SUMMARY OF THE INVENTION

The present invention is directed to a flexible jumper strip and to a method of making it. This jumper strip overcomes the problems of the prior art because the ends of the conductor leads or pins are reinforced by rigid support members which extend into the insulation and which can easily be installed on a mass production basis. Also, the reinforcement of these pins does not require the application of a mechanical stress to the pins. Consequently, the pins do not break and the insulation does not separate from the leads.

In an illustrative embodiment of the invention, the jumper strip is in the form of a printed circuit conductor pattern laminated between two sheets of flexible insulation. The conductor leads or pins which extend beyond the insulation are soldered to rigid support members which have approximately the same shape as the pins themselves and which extend into the insulating covers. The support members are simultaneously located over all of the pins of a jumper strip by means of a lead frame.

An exemplary process for making the jumper strip involves the steps of:

1. laminating a conductor sheet and a smaller adhesive-coated first insulation sheet together so that the conductor sheet extends beyond the area of the first insulation sheet in areas where the termination pins are to be formed;

2. forming a conductor pattern from the conductor sheet so that leads which end in the area beyond the first insulation sheet are created;

3. registering a lead frame of the rigid members over the conductor leads; and 4. soldering together the rigid members and the conductor leads extending beyond the first insulation sheet to form the termination pins.

An additional insulation sheet may be laminated over the top of the conductor pattern. Also, the rigid support members may be in the form of a lead frame configuration that is constructed by either printed circuit image and etch or die piercing techniques to match the lead pattern of the jumper strip.

BRIEF DESCRIPTION OF THE DRAWINGS

The foregoing and other features of the present invention will be more readily apparent from the following detailed description and drawings of an illustrative embodiment of the invention in which.

DESCRIPTION OF AN EXEMPLARY EMBODIMENT

Figure 1:
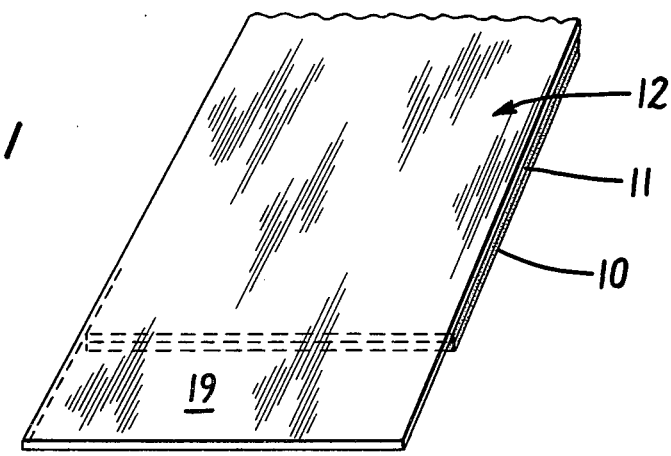
FIGS. 1–5 illustrate the process of forming a jumper strip according to the present invention.

FIG. 1 shows an insulating base sheet 10 laminated to a larger conductor sheet 12 by means of an adhesive film layer 11. This base laminate is used to form the jumper cable with the pins or terminations of the jumper strip being formed in the overhanging region 19 of the conductor sheet. The base laminate is flexible because a flexible conductor, such as two-ounce copper, is typically used with a flexible insulation such as Dupont Kapton ® or Nomex ®.

Figure 2:
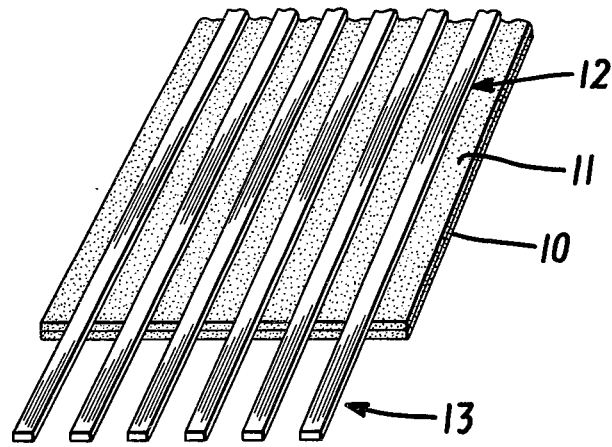

In FIG. 2 a conductor pattern consisting of parallel leads is shown formed from the conductor layer 12. The leads terminate in the area beyond the insulator 10 so as to form the termination pins 13. Various processes may be used to create the conductor pattern but the preferred method is to etch the conductor pattern into the conductor layer. In such a process the conductor layer has the desired conductor pattern printed directly on its exposed surface. This may be done either by screen printing with acid resisting ink or by utilization of any of a number of photo-resist processes. In a photo-resist type of process, the conductor layer is covered with a photo-resist material which is exposed to an image of the desired conductor pattern. The areas of the photo-resist which represent the leads to be formed do not receive any light from the image and continue to adhere to the conductor plane. However, the light striking the photo-resist in the remaining areas allows that material to be removed, thereby leaving a conductor with photo-resist in those areas representing the conductor leads. An acid is then used to etch the exposed conductor areas down to the insulating layer 10. Finally, the photo-resist material over the conductor leads is removed.

Figure 3:
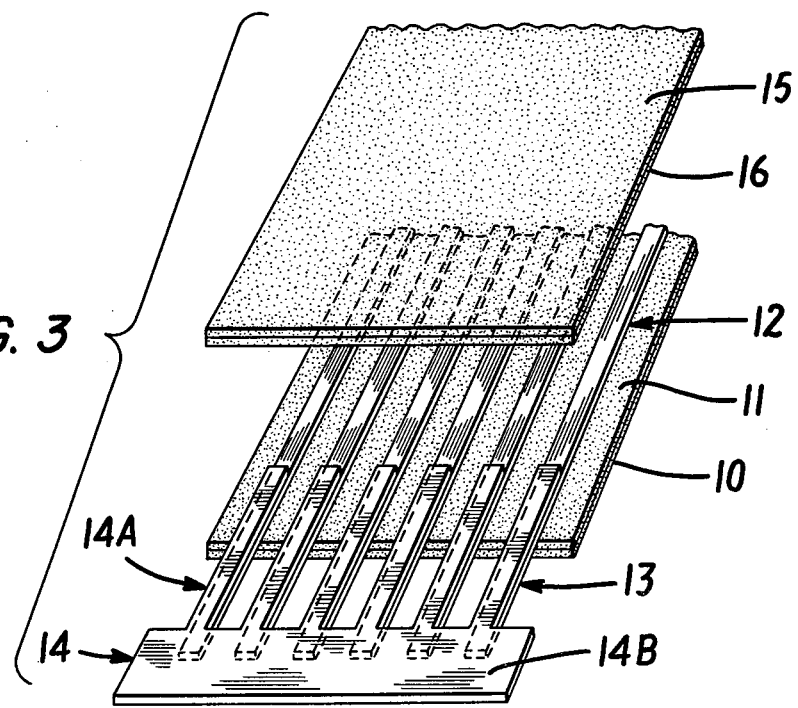

Rigid members with high strength and good solderability are then applied to the pins 13 so as to extend onto the insulating layer. These rigid members are applied as a group in the form of a lead frame 14 as shown in FIG. 3, which has rigid members 14A supported by a web 14B. Lead frame 14 can be constructed by an etching process similar to that used to form the conductor pattern. It can be formed from any convenient material which has both high strength and good solderability. In particular, brass and a beryllium-copper alloy are suitable for this purpose. The material may have any convenient cross section, but a 5-10 mil thickness is preferable. The rigid members 14A of the lead frame may be 0.015 inches wide on the same centers as the pins of the conductor pattern. However, the width is not critical and it can vary up to and even a little larger than the width of the pins themselves.

The lead frame 14 may merely be registered in line with the pins of the conductor pattern or it may be fixed to the conductor pattern by an adhesive. When the adhesive is used, it is confined to the area of the members of the lead frame which extend onto the insulator 10. Besides holding the lead frame 14 in place, the adhesive acts to prevent migration of solder onto the leads. Acrylic-type adhesives are particularly useful for this purpose and for bonding the insulating layers to the conductor.

Figure 4:
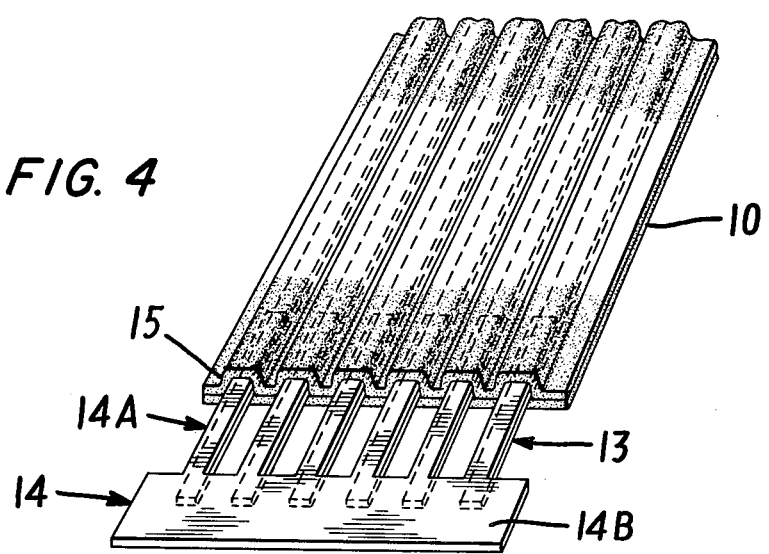
Figure 5:
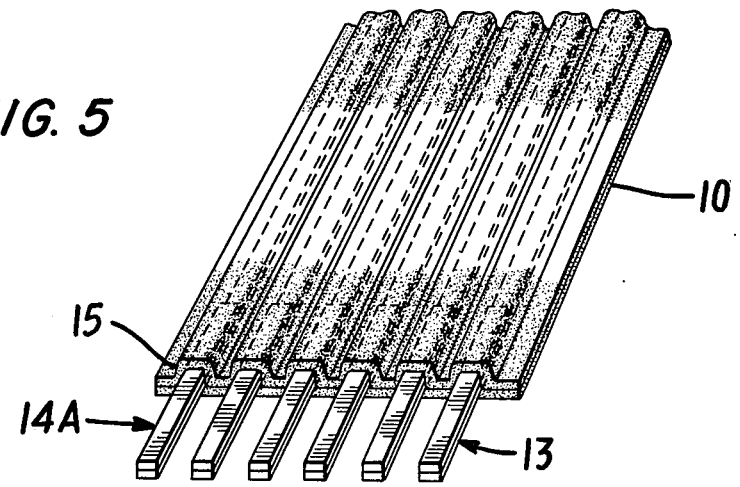

Once the lead frame 14 has been registered or glued in place, a second insulating layer 15 may be laminated over the conductor pattern by means of an adhesive layer 16. The result of this is shown in FIG. 4. At this point, the pins 13 can be dipped in solder in order to connect the rigid members and the pins 13. Then the web 14B of the lead frame is removed and the pins 13 may be soldered again, if desired, as shown in FIG. 5. If no second insulating layer 15 is to be applied, the pins are first soldered immediately after the rigid support members are applied.

With the device shown in FIG. 5 the current is carried by the copper conductor and the rigid members merely act to support the conductor. Since the rigid members extend from the ends of the pins into the insulating envelope, any flexing of the circuit board will take place toward the center of the jumper strip, i.e., away from the pins and the edges of the insulation. Therefore, damage to the pins and separation of the insulating layers is avoided.

While the invention has been particularly shown and described with reference to preferred embodiments thereof, it should be understood by those skilled in the art that various changes in form and details may be made therein without departing from the spirit and scope of the invention.

I claim:

1. A process for making a jumper strip with pin-like lead terminations comprising the steps of:

laminating a conductor sheet and a smaller adhesive-coated first insulation sheet together so that the conductor sheet extends beyond the area of the first insulation sheet in areas where the termination pins are to be formed;

forming a conductor pattern from the conductor sheet, which pattern includes conductor leads ending in the area beyond the first insulation sheet;

registering a lead frame of rigid members separate from the conductor sheet over the conductor leads, at least in the area beyond the first insulation sheet, said lead frame being in a form in which the rigid members are attached to a common web, said rigid members having a length sufficient to extend from the ends of the leads to a position over the first insulation sheet and being spaced on said common web on the same centers as the jumper strip terminations;

soldering together the parts of the rigid members and the conductor leads that extend beyond the first insulation sheet in order to form the termination pins; and removing the web from the frame.

2. A process as claimed in claim 1 further including the step of laminating a second insulation sheet over the conductor pattern on the first insulation sheet prior to the soldering step.

3. A process as claimed in claim 1 further including the steps of:

applying an adhesive to the parts of the rigid members adapted to rest over the first insulation sheet, and attaching the rigid members to the laminate by the adhesive after the step of registering so as to prevent the solder from flowing onto the portion of the leads on the insulation sheet during the soldering step.

4. A process as claimed in claim 1 wherein the step of forming a conductor pattern involves etching the conductor sheet so as to leave only the conductor leads of the jumper strip.

5. A process as claimed in claim 1 further including the step of soldering the pins for a second time after the web has been removed.

* * * * *